(12) United States Patent
Yang et al.

(10) Patent No.: US 9,018,083 B2
(45) Date of Patent: Apr. 28, 2015

(54) ELECTRICALLY ACTUATED DEVICE AND METHOD OF CONTROLLING THE FORMATION OF DOPANTS THEREIN

(71) Applicant: Hewlett-Packard Development Company, L.P., Houston, TX (US)

(72) Inventors: Jianhua Yang, Palo Alto, CA (US);
Duncan Stewart, Menlo Park, CA (US);
Philip J. Kuekes, Menlo Park, CA (US);
William Tong, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/286,513

(22) Filed: May 23, 2014

(65) Prior Publication Data

US 2014/0256123 A1    Sep. 11, 2014

Related U.S. Application Data

(62) Division of application No. 13/121,133, filed on May 4, 2011, now Pat. No. 8,766,228.

(51) Int. Cl.
*H01L 21/22* (2006.01)
(52) U.S. Cl.
CPC ..................... *H01L 21/22* (2013.01)
(58) Field of Classification Search
CPC . H01L 28/55; H01L 45/146; H01L 27/11502; H01L 28/75; H01L 45/08; H01L 27/11206; H01L 27/2463; H01L 21/28291; H01L 45/1641; H01L 45/1266

USPC ........... 438/238, 250–256, 382, 393–397, 95, 438/131–132, 180–181, 185, 542–545

See application file for complete search history.

(56) References Cited

U.S. PATENT DOCUMENTS

| | | | |
|---|---|---|---|
| 5,723,171 A | 3/1998 | Cuchiaro et al. | |
| 5,970,337 A | 10/1999 | Nishioka | |
| 6,458,621 B1 | 10/2002 | Beck | |
| 6,489,644 B1 * | 12/2002 | Seon | 257/295 |
| 6,855,647 B2 | 2/2005 | Beck et al. | |
| 7,220,983 B2 | 5/2007 | Lung | |
| 2003/0143790 A1 | 7/2003 | Wu | |
| 2003/0173612 A1 | 9/2003 | Krieger et al. | |

(Continued)

FOREIGN PATENT DOCUMENTS

| | | |
|---|---|---|
| CN | 1787224 A | 6/2006 |
| JP | 2005-026576 | 1/2005 |

(Continued)

OTHER PUBLICATIONS

Blanc, "Electrocoloration in SrTiO3: Vacancy Drift . . . ", Physical REview B, V4(10), Nov. 15, 1971, pp. 3548-3557.

(Continued)

*Primary Examiner* — H Tsai
(74) *Attorney, Agent, or Firm* — Dierker & Associates (57) ABSTRACT

In an example of a method for controlling the formation of dopants in an electrically actuated device, a predetermined concentration of a dopant initiator is selected. The predetermined amount of the dopant is localized, via diffusion, at an interface between an electrode and an active region adjacent to the electrode. The dopant initiator reacts with a portion of the active region to form the dopants.

11 Claims, 4 Drawing Sheets

(56) References Cited

U.S. PATENT DOCUMENTS

| | | |
|---|---|---|
| 2004/0173823 A1 | 9/2004 | Murai |
| 2005/0006640 A1 | 1/2005 | Jackson et al. |
| 2007/0117256 A1 | 5/2007 | Stewart et al. |
| 2008/0001172 A1 | 1/2008 | Karg et al. |
| 2008/0078985 A1 | 4/2008 | Meyer et al. |
| 2008/0079029 A1 | 4/2008 | Williams |
| 2008/0090337 A1 | 4/2008 | Williams et al. |
| 2010/0237317 A1* | 9/2010 | Tsunoda ............... 257/4 |
| 2010/0258782 A1 | 10/2010 | Kuse et al. |

FOREIGN PATENT DOCUMENTS

| | | |
|---|---|---|
| JP | 2008-038365 | 2/2008 |
| WO | WO-2006/075574 | 7/2006 |
| WO | WO-2008/054400 | 5/2008 |
| WO | WO-2008/088720 | 7/2008 |
| WO | WO-2008/108822 | 9/2008 |
| WO | WO-2009/072213 | 6/2009 |

OTHER PUBLICATIONS

Choi, "Resistive switching mechanism of TiO2 . . . ", Jrnl of Applied Physics 98 (2005, pp. 033715-1-033715-10, Aug. 15, 2005.

CN Search Report, Oct. 29, 2008.

Dearnaley et al, "Electrical phenomena in amorphouse oxide films", Rep. Prog. Phys., 1970, (33), pp. 1129-1191.

European Search Report (Mar. 16, 2012), EP Patent Application No. 08877855.0, Filed Apr. 26, 2011.

Jeong, et al, "Impedance spectroscopy of TiO2 thin films showing . . . ", Applied Physics Letter 89, 2006, pp. 082909-1-082909-3.

Knauth, "Defect and Transport Properties of Noncrystalline . . . ", J. Solid State Electrochem, (2002), v. 6 pp. 165-171.

Meijer, "Who Wins the Nanovolatile Memory Race?", Science, V319, Mar. 21, 2008, pp. 1625-1626.

Rothchild, "Electronic and Transport Properties of Reduced and Oxidized . . . ", Applied Physics Letters, V.82(4), Jan. 27, 2003, pp. 574-576.

Sawa et al, "Resistive switching in transition metal oxides", Materials Today, V.11(6), Jun. 2008, pp. 28-36.

Strukov et al, "Exponential ionic drift: fast switching and low volatility . . . ", Applied Physics A, Nov. 28, 2008, 5 pages.

Strukov et al, "The missing memristor found", Nature Letters, V453, May 1, 2008, pp. 80-83.

Waser et al, "Nanoionics-based resistive switching memories", Nature Materials, V6, Nov. 2007, pp. 833-840.

Weibel et al, "Electrical Properties and defect chemisty of anatase . . . ", Solid State Ionics 177 (2006), pp. 229-236.

Yang et al, Memristive switching mechanism for metal/oxide/mietal nanodevices, Nature Nanotechnology, V3, Jul. 2008, pp. 429-433.

* cited by examiner

ELECTRICALLY ACTUATED DEVICE AND METHOD OF CONTROLLING THE FORMATION OF DOPANTS THEREIN

CROSS-REFERENCE TO RELATED APPLICATIONS

This application is a divisional application of co-pending U.S. patent Ser. No. 13/121,133, filed May 4, 2011, which is itself a U.S. National Stage filing under 35 U.S.C. §371 of PCT application S.N. PCT/US2008/081567, filed Oct. 29, 2008, both of which are incorporated by reference herein.

BACKGROUND

Nanometer-scale crossed-wire switching devices have previously been reported that could be switched reversibly and had an ON-to-OFF conductance ratio of about $10^3$. Such devices have been used to construct crossbar circuits and provide a promising route for the creation of ultra-high density nonvolatile memory. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of examples of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

FIGS. 2A and 2D through 2F are schematic views depicting another example of the method for forming an example of the electrically actuated device;

FIGS. 2A and 2G-2I are schematic views depicting still another example of the method for forming an example of the electrically actuated device;

DETAILED DESCRIPTION

The present disclosure relates generally to electrically active devices and methods of controlling the formation of dopants in such electrically active devices.

Examples of the device disclosed herein include an active region located between two wires. Contact regions between the metal electrodes and the semiconductor active region resemble Schottky barriers. In some instances, a chemical reaction between the active region and a dopant initiator introduced in contact therewith forms localized dopants of a desirable concentration which may be tailored to achieve desirable interface properties (such as, e.g., Schottky barrier heights and/or widths), and thus desirable electrical properties. In other instances, a dopant itself is localized adjacent the active region, and such dopant may also be tailored to achieve desirable interface properties, and thus desirable electrical properties.

As used herein, the term "dopant initiator" generally refers to a species that is capable of chemically reacting with the active region to form dopants, and the term "dopants" generally refers to a species that is capable of modifying electrical properties of a device. In some instances, the dopants are charged, active/mobile dopants, and in other instances, the dopants are uncharged dopants. Some charged dopants that are electrically active/mobile in the active region are, for example, oxygen vacancies in titanium dioxide. Other charged dopants are less electrically active/mobile in the active region, such as, for example, carbon anions or nitrogen anions in titanium dioxide.

The localized dopants may be formed (from a dopant initiator reacting with the active region) or physically diffused such that they are present either inside the active region (e.g., forming channels) or at the top and/or bottom surfaces of the active region (e.g., forming a continuous layer or non-continuous clusters at the interface(s) between the active region and the electrode(s)). In either instance, the dopants function as seeds for switching centers within the device.

Mobile dopants will drift under an electric field and will change the interface properties. Uncharged dopants and dopants with less electrical mobility will generally not drift under an electric field, but will remain at the interface of the active region and the electrode(s). These uncharged or less mobile dopants may be used to tailor the interface properties (as opposed to changing them during device operation). As such, during manufacturing, the devices disclosed herein may be tailored to achieve desirable electrical properties.

The device yield is relatively high (e.g., from about 90% to about 100%), which is advantageous, at least in part, because the device is reliable. In some examples, the device disclosed herein is reconfigurable, meaning that it can change its state multiple times via a reversible process, such as an oxidation or reduction reaction. In other words, the devices disclosed herein can be opened and closed multiple times, such as the memory bits in a random access memory (RAM). In other examples, the device disclosed herein may be singly configurable, meaning that it can change its state once via an irreversible process such as an oxidation or reduction reaction. Such a switch can be the basis of, for example, a programmable read only memory (PROM).

Unless specified otherwise hereinbelow, the following definitions apply.

The term "self-aligned" as applied to "junction" means that the junction that forms the switch and/or other electrical connection between two wires is created wherever two wires, either of which may be coated or functionalized, cross each other, because it is the act of crossing that creates the junction.

Micron-scale dimensions refer to dimensions that range from 1 micrometer to a few micrometers in size. Sub-micron scale dimensions refer to dimensions that range from 1 micrometer down to 0.04 micrometers. Nanometer scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

A crossbar is an array of switches wherein each wire in one set of parallel wires connects to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

In the examples discussed in reference to the Figures, mobile dopants are illustrated. This is for illustrative purposes, and it is to be understood that any of the examples disclosed herein may be fabricated with less electrically mobile dopants or uncharged dopants as described hereinabove.

Figure 1A:
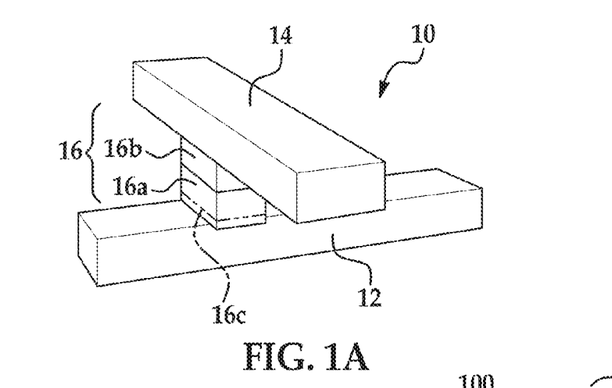
FIG. 1A is a perspective view of an example of a solid-state electrically actuated switch connecting two different crossed wires.
Figure 1B:
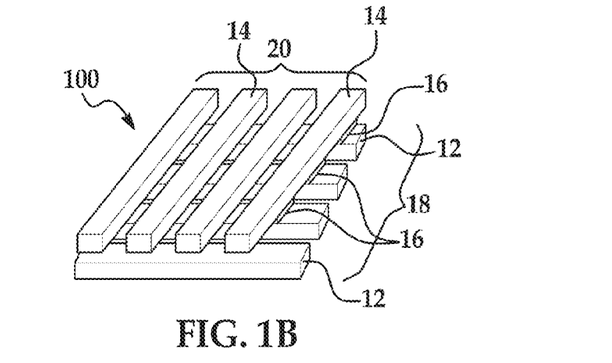
FIG. 1B is a perspective view showing an array of the switches of FIG. 1A, also known as a crossbar.

Referring now to FIGS. 1A and 1B, a known solid-state electrically actuated switch 10 and a known cross-bar array 100 are depicted. In FIG. 1A, two different crossed wires or electrodes 12, 14 have a switch junction 16 therebetween. The switch junction 16 includes a primary active region 16a and a secondary active region 16b. In one example, the primary active region 16a is a material that is both an electronically semiconducting and a weak ionic conductor (discussed further hereinbelow) that can be doped with electron donors as interstitials, vacancies, or impurities. In another example, the material of the primary active region 16a is both nominally electrically insulating and a weak ionic conductor. The secondary active region 16b is a material that acts as a source and sink of the doping species. As shown in FIG. 1A, the switch junction 16 may also include the molecular layer 16c as a non-covalently bonded interface, where the molecular layer 16c includes molecules that may or may not be switchable. One or both wires 12, 14 may be metal or semiconductor materials. In some instances, both wires 12, 14 are metal.

A crossbar array 100 may also be formed including a plurality of the solid-state electrically actuated switches 10 shown in FIG. 1A. As shown in FIG. 1B, a first layer 18 of approximately parallel wires 12 is overlain by a second layer 20 of approximately parallel wires 14. The second layer 20 is roughly perpendicular, in orientation, to the wires 12 of the first layer 18. It is to be understood, however, that the orientation angle between the layers 18, 20 may vary. The two layers 18, 20 of wires 12, 14 form a lattice, or crossbar. Each wire 14 of the second layer 20 overlies all of the wires 12 of the first layer 18, and comes into close contact with each wire 12 of the first layer 18 at wire intersections that represent the closest contact between two wires 12, 14. The switch junction 16 is shown disposed between wires 12, 14. While three such switch junctions 16 are shown, it is to be understood that a switch junction 16 is formed at each intersection of a wire 12 with a wire 14. Such crossbars 100 may be fabricated from micron-, submicron- or nanoscale-wires, depending on the application.

Although individual wires 12, 14 in the figures are shown with square or rectangular cross-sections, wires may also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions, in addition to nanowires.

As is well known, such switches may be used as the basis for memories (e.g., the storage of a bit of information, 1 or 0), as either a closed or open switch in a cross-point memory, for configuration bits in a logic circuit that resembles a Field Programmable Gate Array, or as the basis for a wired-logic Programmable Logic Array. These switches also find uses in a wide variety of other applications.

Figure 2A:
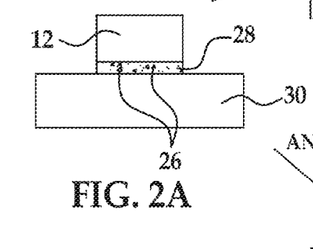
FIGS. 2A through 2C are schematic views depicting one example of the method for forming an example of the electrically actuated device.
Figure 2B:
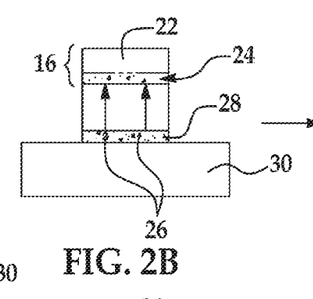
Figure 2C:
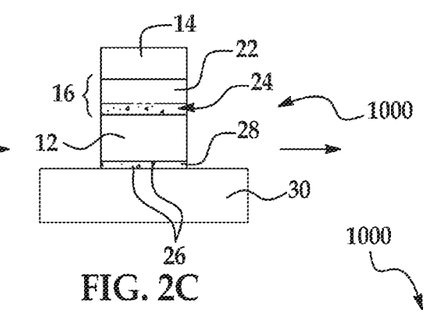
Figure 2D:
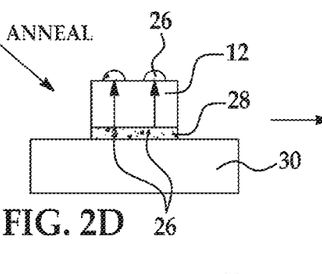
Figure 2E:
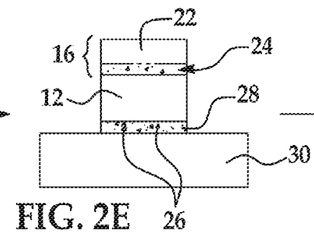
Figure 2F:
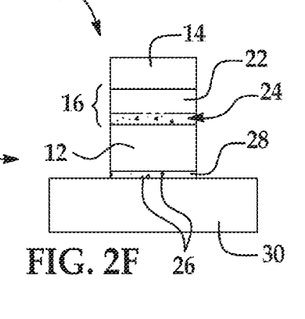
Figure 2G:
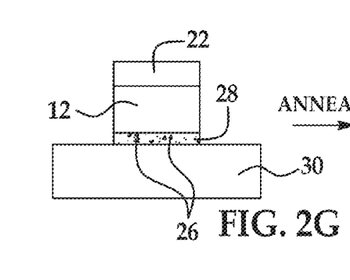
Figure 2H:
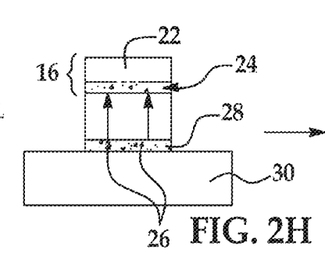
Figure 2I:
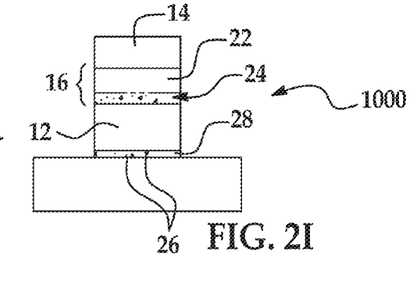

Referring now to FIGS. 2A-2I, various examples of the method of forming an example of the electrically actuated device 1000 are depicted. The devices 1000 are shown in FIGS. 2C, 2F, and 2I. Such devices 1000 function similarly to the device 10 shown in FIG. 1A. It is to be understood that the electrically actuated devices 1000 disclosed herein may be built at the micro- or nano-scale and may be used as a component in a wide variety of electronic circuits. The device 1000 may include two different wires, such as a pair of crossing wires shown in FIGS. 1A-1B, which may be two wires in a larger crossbar array; or it may include multiple segments of a single wire (with the active region between adjacent segments) in order to allow or block the flow of current along the wire. The devices 1000 disclosed herein may be used as the basis for memories, switches, and logic circuits and functions, as described above.

As shown in FIGS. 2C, 2F and 2I, this example of the device 1000 includes two wires/electrodes 12, 14, an active region 22 therebetween, and mobile dopants 24 formed from a chemical reaction between a portion of the active region 22 and a diffused dopant initiator 26 (shown in, for example, FIGS. 2B, 2D and 2H). It is to be understood that in some instances, the mobile dopants 24 disclosed herein may be contained in a layer that is formed as a result of the chemical reaction between the portion of the active region 22 and the diffused dopant initiator 26 (or deposited dopant initiator 26', see FIGS. 5A through 5C).

In FIG. 2A, one electrode 12 is established on a dopant initiator layer 28, which is established on a substrate 30. The substrate 30 may be any desirable material, including, but not limited to semiconductor materials. Non-limiting examples of specific substrate 30 materials include silicon dioxide, silicon nitride, magnesium oxide, strontium titanate, glass, or the like.

The dopant initiator layer 28 is established on the substrate 30 and includes at least one dopant initiator 26 therein. Generally, the dopant initiator 26 is selected such that, upon chemical reaction with the portion of the active region 22, a desirable dopant (e.g., mobile dopant 24) for the active region 22 is formed. Since the chemical reaction between the dopant initiator 26 and a portion of the active region 22 (discussed further hereinbelow) forms the mobile dopants 24, the concentration of the dopant initiator 26 and the material selected for the dopant initiator 26 depend, at least in part, on the material used for the active region 22, the thickness of the active region 22, and the desirable type and amount of mobile dopants 24 to be formed. Non-limiting examples of suitable dopant initiators 26 include titanium, chromium, aluminum, magnesium, zinc, niobium, tantalum, manganese, vanadium, zirconium, or hafnium. In one non-limiting example, when the active region 22 is formed of titanium dioxide, the dopant initiator 26 selected may be titanium, which creates vacancies (one example of a mobile dopant 24) in titanium dioxide.

In the examples shown in the FIG. 2 series, the dopant initiator layer 28 is established on the substrate 30. It is to be understood, however, that the dopant initiator layer 28 may also be established on the other electrode 14. This example is shown and discussed in reference to FIG. 3.

The dopant initiator layer 28 may be established on the substrate 30 via any suitable technique, such as, for example, sputtering, e-beam evaporation, molecular beam epitaxy, chemical vapor deposition (CVD), or atomic layer deposition (ALD). The thickness of the dopant initiator layer 28 depends, at least in part, on the amount of dopant initiator 26 that is to diffuse through the adjacent electrode 12, 14, and on the desirable switching properties of the device 1000. As one non-limiting example, the thickness of the dopant initiator layer 28 is about 5 nanometers. In another non-limiting example, the thickness ranges from about 5 nanometers to about 30 nanometers. It is to be understood that the thickness may be varied as is desirable. Generally, the thicker the layer 28, the more dopant initiator 26 that is available for diffusion, and the more dopant initiator 26 that diffuses, the lower the device resistance becomes. Similarly, the thinner the layer 28, the less dopant initiator 26 that is available for diffusion, and the less dopant initiator that diffuses, the higher the device resistance becomes.

The bottom electrode 12 may be fabricated on the dopant initiator layer 28 (and in some instances on the substrate 30) using conventional techniques, such as photolithography or electron beam lithography, or by more advanced techniques, such as imprint lithography. In one example, the thickness of the bottom electrode 12 ranges from about 5 nm to about 30 nm. The thickness may be varied, depending, at least in part, on the desirable diffusion properties and the thickness of the dopant initiator layer 28. The bottom electrode 12 may be any suitable conductive material, such as gold, platinum, tungsten, copper, etc.

Referring now to FIGS. 2B and 2C, one example of the method includes hot deposition of the active region 22 on the electrode 12 (as shown in FIG. 2B), and establishment of the other electrode 14 on the active region 22 (as shown in FIG. 2C).

In the examples disclosed herein, the active region 22 is capable of transporting and hosting ions that act as dopants to control the flow of electrons through the device 1000. The basic mode of operation of the device 1000 is to apply an electrical field (the drift field, which may exceed some threshold for enabling the motion of the ions in the active region 22) across the device 1000 large enough to cause the mobile dopants 24 to be transported within of the active region 22 via ionic transport. The mobile dopants 24 are generally an ionic species that change the electrical conductivity of the active region 22 from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). As such, the reconfiguration of the dopant profile under electric field changes the electrical transport behavior of the junction 16.

The active region 22 is also a thin film (e.g., equal to or less than 500 nm) of a material that is electronically semiconducting or nominally electrically insulating and is a weak ionic conductor. It is to be understood that the definition of weak ionic conductor depends upon the application for which the device 1000 is designed. The mobility and the diffusion constant for a species in a lattice are directly proportional to one another, via the "Einstein relation". Thus, if the mobility of ionized species in a lattice is very high, so is the diffusion constant. In general, it is desired for a device 1000 to stay in a particular state, ON or OFF, for an amount of time that may range from a fraction of a second to years, depending on the application. Thus, the diffusion constant for such a device 1000 is, in an example, low enough to ensure the desired level of stability, to avoid inadvertently turning the device 1000 from ON to OFF or vice versa via ionized species diffusion, rather than by intentionally setting the state of the device 1000 with a voltage pulse. Therefore, a "weak ionic conductor" is one in which the ion mobility, and thus the diffusion constant, is small enough to ensure the stability of the ON or OFF state of the device 1000 for as long as necessary under the desired conditions (e.g., the device 1000 does not change state because of diffusion of the mobile dopants 24).

As such, the active region 22 material and the dopant initiators 26 (which form the mobile dopants 24) are selected such that the drift of the mobile dopants 24 into or out of the active region 22 is possible, but not too facile. This generally ensures that the device 1000 will remain in whatever state it is set for a reasonably long time. This also contributes to the device 1000 being nonvolatile (i.e., it holds its state after the drift field has been removed). In some instances, the device 1000 is a two-terminal device—applying a high bias to the device 1000 causes both electron current and ion current to flow, whereas at a low bias the flow of ion current is negligible, which allows the device 1000 to hold its resistance state.

Non-limiting examples of suitable materials for the active region 22 include oxides, sulfides, selenides, nitrides, phosphides, arsenides, chlorides, and bromides of silicon, transition metals, rare earth metals, or alkaline earth metals. Examples of other suitable materials are also further described hereinbelow.

Referring specifically to FIG. 2B, the hot deposition of the active region 22 may be accomplished by exposing the electrode 12 and dopant initiator layer 28 to heat while depositing the material for the active region 22 on the electrode 12. Suitable deposition techniques include conventional physical and chemical techniques, including evaporation from a Knudsen cell, electron beam (i.e., e-beam) from a crucible, sputtering from a target, e-beam evaporation, chemical vapor deposition (CVD), molecular beam epitaxy, atomic layer deposition, or various other forms of chemical vapor or beam growth from reactive precursors. Appropriate deposition or growth conditions, such as speed and temperature, may be selected to achieve the desirable chemical composition and local atomic structure desired for the active region 22.

The temperature during the hot deposition process is sufficient to cause some or all of the dopant initiators 26 in the dopant initiator layer 28 to diffuse through the adjacent electrode 12 to a surface thereof. By adjusting the temperature, the kinetics of diffusion may be controlled, and desirable diffusion of the dopant initiator 26 may be achieved. The temperature and the time for exposure to such temperature may also depend, at least in part, on the amount of dopant initiator 26 to be diffused and the thickness of the layers 12, 28. In one example, the temperature ranges from about 200° C. and about 450° C.

In the examples shown in the FIG. 2 series, diffusion of the dopant initiators 26 takes place through the grain boundaries in the electrode 12. As such, the grain boundaries of the electrode 12 may be selected to achieve desirable diffusion.

Since at least some of the dopant initiators 26 diffuse from the layer 28, the layer 28 in the resulting device 1000 is generally thinner than the layer 28 prior to diffusion.

The diffused dopant initiators 26 react with a portion (e.g., a few nanometers or less) of the active region 22 established on the electrode 12. This chemical reaction forms a layer having mobile dopants 24 therein at the interface between the remaining active region 22 and the electrode 12. It is to be understood that since diffusion will generally be greater in the locations of the electrode grain boundaries than in other locations of the electrode 12, the layer having mobile dopants 24 therein may be non-uniform or discontinuous. Non-limiting examples of dopants 24 that result from the chemical reaction include interstitials, vacancies or other charged impurities. Such mobile dopants 24 are positively or negatively charged. In one non-limiting example, titanium (e.g., dopant initiator 26) may diffuse through a platinum electrode 12 and react with titanium dioxide (e.g., active region 22). This chemical reaction causes the reduction of a portion of the metal oxide (i.e., active region 22), resulting in the formation of a $TiO_{2-x}$ layer at the interface between the remaining titanium dioxide active region 22 and the platinum electrode 12. This $TiO_{2-x}$ layer has a small deficit of oxygen atoms in the crystal structure, and the sites where the missing oxygen atoms would be positively charged vacancies, or mobile dopants 24.

After the formation of the mobile dopants 24, the top electrode 14 is deposited on the active region 22 (as shown in FIG. 2C). The top electrode 14 may be the same or a different material than the bottom electrode 12, and may be established via the same or a different technique than that used to establish the bottom electrode 12. In one example, the top electrode 14 is evaporated with an electron beam evaporator. The thickness of the top electrode also generally ranges from about 5 nanometers to as many as hundreds of nanometers.

In the examples shown in FIGS. 2C, 2F and 2I, the potential difference between the metal contact (i.e., top electrode 14) and the active region 22 forms a tunneling barrier at this interface. The tunneling barrier blocks current flow between the electrodes 12, 14, and thus the device is in an OFF state. In the OFF state, one interface in the device 1000 contains mobile dopants 24 and is an ohmic-like contact, and the other interface contains few, if any, mobile dopants 24 and is a non-ohmic-like contact. The tunneling barrier limits the electronic transport across the junction 16 until a voltage that exceeds the threshold field for the drift of the mobile dopants 24 is applied to the device 1000. In the OFF state, the active region 22 is essentially intrinsic, i.e., there are very few dopants 24 in the lattice. In such instances, the interface contact governs the electrical transport of the junction 16.

Upon application of a suitable voltage, the mobile dopants 24 drift towards the non-ohmic interface, thereby creating localized conductance channels across the active region 22. This shunts the electronic tunneling barrier at the non-ohmic interface and turns the device ON. The opposite electric field pushes the mobile dopants 24 back toward the ohmic interface and restores the electronic tunneling barrier at the interface between the active region 22 and the top electrode 14. It is to be understood that the rectification orientation of the device 1000 in its initial state determines the switching polarity of the device 1000. As such, in these instances, the polarity of the device 1000 may be altered by altering the rectification orientation of the device 1000 in its initial state.

In one non-limiting example, the device 1000 in its initial state is strongly rectified. As such, positively charged mobile dopants 24, such as oxygen vacancies in a $TiO_{2-x}$ layer, are driven into the active region 22 by applying a negative bias voltage across the junction 16 that exceeds the threshold field for the drift of an ionized species. The layer formed at the interface (e.g., a $TiO_{2-x}$ layer) between the electrode 12 and the active region 22 contains a relatively high concentration of vacancies (mobile dopants 24), and is therefore a reasonably good conductor. Upon the application of a negative voltage to electrode 12, the oxygen vacancies (mobile dopants 24) are driven into the active region 22 (it is reduced). The effect on the electrical conductivity of the interface between the electrode 12 and the active region 22 is relatively small since a small number of the vacancies are pushed out of this region, but the electrical conductivity of the active region 22 increases dramatically (switch ON) since it is going from a state in which there were no vacancies to one in which there are some.

As long as the doping level of the active region 22 is not so large that the resistance drops essentially to zero, it is possible to reverse the drift of the mobile dopants 24 and eject them from the active region 22 by reversing the polarity of the voltage applied to the device 1000. In the example provided hereinabove, the device 1000 may be switched back to the OFF state by inverting the polarity of the voltage to a positive voltage on the electrode 12.

It is to be understood that doping of the active region 22 is a function of both voltage (to exceed any energy barrier for ion drift) and time (the longer the system is held at voltage, the more dopants accumulate), or the integral of the current.

While the above switching mechanism is one example of how the devices 1000, 1000' (shown in FIG. 3), 1000'' (shown in FIG. 4) disclosed herein operate, is to be understood that the switching mechanism may be different. As mentioned hereinabove, another non-limiting example of a possible switching mechanism includes the mobile dopants 24 forming conducting filaments that bridge the bottom and top electrodes 12, 14 when the device 1000, 1000', 1000'' is in the ON state. This bridge may be broken by application of an electric field or Joule heating, thereby switching the device 1000 to the OFF state.

Referring now to FIGS. 2D through 2F, another example for forming the device 1000 is shown. The formation of the mobile dopants 24 is initiated by annealing the dopant initiator layer 28 and the electrode 12 prior to deposition of the active region 22. The annealing temperature (similar to the hot deposition temperature previously discussed) is sufficient to cause some or all of the dopant initiators 26 in the dopant initiator layer 28 to diffuse through the adjacent electrode 12 to a surface thereof (as shown in FIG. 2D). The temperature and the time for exposure to such temperature may also depend, at least in part, on the amount of dopant initiator 26 to be diffused and the thickness of the layers 12, 28. In one example, the temperature ranges from about 200° C. and about 450° C.

After annealing, the material for the active region 22 is deposited on the diffused dopant initiators 26 and on any exposed surface of the electrode 12, as shown at FIG. 2E. Techniques for the deposition of and materials for the active region 22 are described hereinabove. Upon being established, a portion of the active region 22 in contact with the diffused dopant initiators 26 reacts therewith to form the layer including mobile dopants 24 at the interface between the remaining active region 22 and the electrode 12. The top electrode 14 may then be established on the active region 22, as shown in FIG. 2F.

FIGS. 2G through 2I depict still another example of the method of forming the device 1000. In this example, the active region 22 is deposited on the electrode 12 (FIG. 2G), and then the structure is exposed to annealing to induce the diffusion of the dopant initiator 26 to the surface of the electrode 12 (FIG. 2H). The diffused dopant initiator 26 reacts with a portion of the active region 22 to form the mobile dopants 24. The top electrode 14 may then be established on the active region 22, as shown in FIG. 2I.

Figure 3:
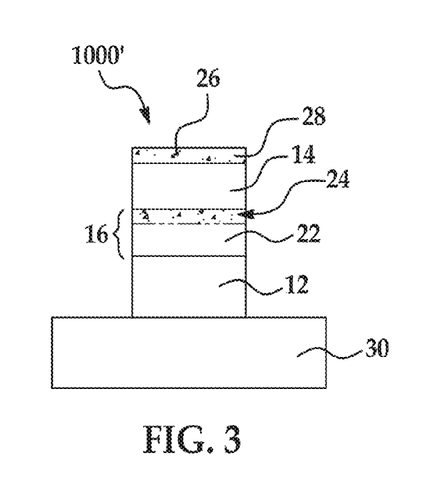
FIG. 3 is a schematic view of another example of the electrically actuated device.

Referring now to FIG. 3, another example of the device 1000' is depicted. This device 1000' is similar to the device 1000 shown in FIGS. 2C, 2F and 2I, except that the dopant initiator layer 28 is established on the top electrode 14, and thus the mobile dopants 24 are formed at the interface between the top electrode 14 and the active region 22, while the interface between the bottom electrode 12 and the active region 22 remains non-conductive and thus forms a tunneling barrier when the device 1000' is in an OFF state. In this example, the polarity of the voltage applied to switch the device 1000' between ON and OFF states will also be determined by the rectification orientation of the device 1000' in its initial state.

In order to form the device 1000' shown in FIG. 3, the electrode 12 is established on the substrate 30, the active region 22 is established on the electrode 12, the top electrode 14 is established on the active region 22, and then the dopant initiator layer 28 is established on the electrode 14. The structure is annealed to initiate diffusion of the dopant initiators 26 (not shown in FIG. 3) through the electrode 14. The diffused dopant initiators 26 react with the portion of the active region 22 adjacent to the electrode 14 to form the layer including the mobile dopants 24. The annealing temperature is selected as set forth herein.

Figure 4:
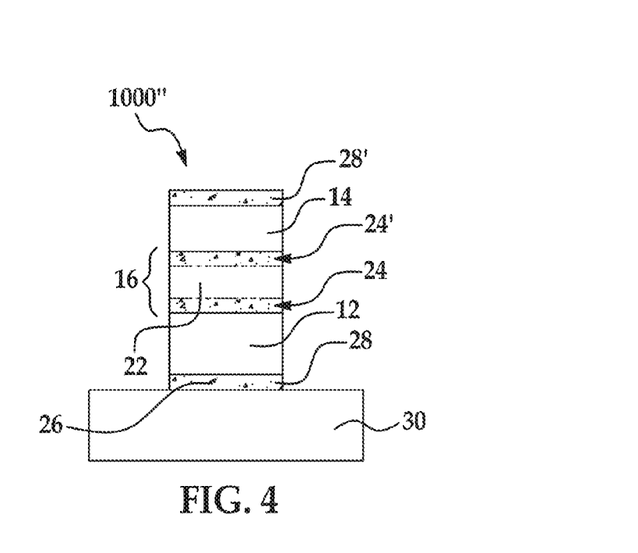
FIG. 4 is a schematic view of still another example of the electrically actuated device.

Referring now to FIG. 4, in still another example of the device 1000", dopant initiator layers 28, 28' may be established adjacent to each of the first and second (bottom and top) electrodes 12, 14. Diffusion may generally be initiated via annealing, and layers having the mobile dopants 24, 24' therein will respectively be formed at the interface between the bottom electrode 12 and the active region 22 and the interface between the top electrode 14 and the active region 22. It is to be understood that the dopant initiators 26 (not shown in FIG. 4) in the two layers 28, 28' may be the same or different, depending on the desirable mobile dopants 24, 24' to be formed.

While the examples discussed in reference to FIGS. 2A through 2I, 3 and 4 utilize mobile dopants 24, it is to be understood that electrically charged but less mobile dopants or uncharged dopants may also be utilized in such examples. The formation of electrically charged but less mobile dopants is similar to that of the electrically charged mobile dopants 24, i.e., a chemical reaction between the active region and a suitable dopant initiator takes place. However, when uncharged dopants are utilized, a chemical reaction may not take place. In such instances, it is to be understood that a layer of uncharged dopants (e.g., gold, platinum, palladium, ruthenium, or the like) may be used instead of the dopant initiator layer 28. Any of the previously described methods of achieving diffusion may be used to move at least some of the uncharged dopants through the desirable electrode 12, 14 and to the interface between that electrode 12, 14 and the active region 22. In this example, the diffused uncharged dopants do not chemically react with the active region 22, rather they are present at the interface as the dopant.

In the various examples shown in FIGS. 2A through 2I and in FIGS. 3 and 4, it is to be understood that the diffusion of the dopant initiators 26 may be controlled by a variety of techniques. Such control also enables control over the localization and the concentration of the mobile (or other) dopants 24, and thus enables tailoring of the interface and device properties. By altering one or more of the following conditions, diffusion may be varied, and thus the amount of mobile dopants 24 formed may be increased or decreased. Diffusion may be altered by adjusting one or more of the following: adjusting a thickness of the electrode 12, 14 through which diffusion occurs; adjusting a grain size of the electrode 12, 14 through which diffusion occurs; adjusting a temperature at which diffusion is accomplished; adjusting a period of time for which diffusion is accomplished; or adjusting a thickness of the dopant initiator layer 28 (and thus a concentration of dopant initiators 26). As a non-limiting example, diffusion may be increased by increasing the grain boundaries of the electrode 12, 14 through which diffusion occurs and by increasing the thickness of the dopant initiator layer 28.

Figure 5A:
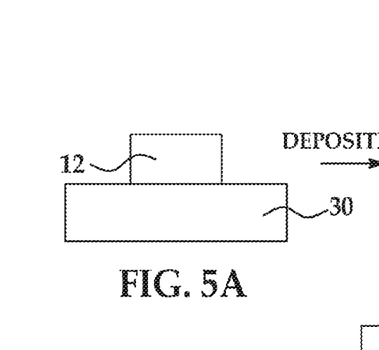
FIGS. 5A through 5C are schematic views depicting another example of the method for forming another example of the electrically actuated device.
Figure 5B:
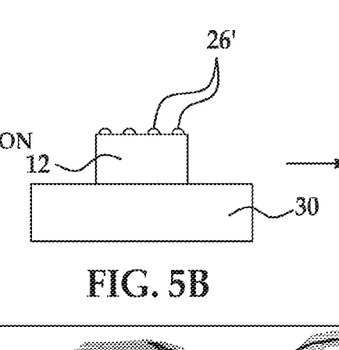
Figure 5C:
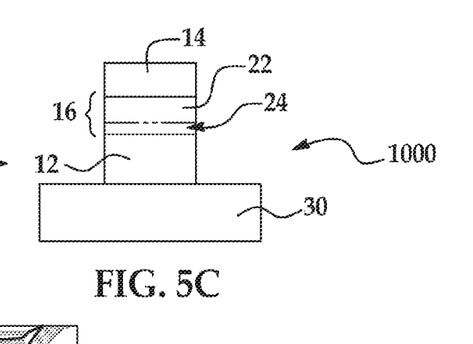

Referring now to FIGS. 5A through 5C, still another example of the method for forming the device 1000 is depicted. As shown in FIG. 5A, the electrode 12 is established on the substrate 30. The electrode 12 may be formed of any desirable material, and may be established via any suitable technique previously.

In this example, as shown in FIG. 5B, the dopant initiators 26' are directly deposited onto the surface of the electrode 12. Such deposition may be accomplished by sputtering, e-beam evaporation, molecular beam epitaxy, chemical vapor deposition (CVD), or atomic layer deposition (ALD). In one example, the deposited dopant initiators 26' form a thin layer, which is, for example, less than 3 nanometers thick. A relatively thin layer of dopant initiators 26' is desirable so that only a portion of the active region 22 reacts to form the layer having mobile dopants 24 therein.

The material for the active region 22 is then deposited on the deposited dopant initiators 26' and on any exposed surface of the electrode 12, as shown at FIG. 5C. Techniques for the deposition of and materials for the active region 22 are described hereinabove. Upon being established, a portion of the active region 22 in contact with the deposited dopant initiators 26' reacts therewith to form the layer incorporating mobile dopants 24 therein at the interface between the remaining active region 22 and the electrode 12. The top electrode 14 may then be established on the active region 22, as shown in FIG. 5C.

While the example discussed in reference to FIGS. 5A through 5C utilizes mobile dopants 24, it is to be understood that electrically charged but less mobile dopants or uncharged dopants may also be utilized in this. The electrically charged less mobile dopants are formed similarly to the mobile dopants 24. However, when uncharged dopants are utilized, no chemical reaction takes place. In such instances, the uncharged dopants (e.g., gold, platinum, palladium, ruthenium, or the like) may be deposited instead of the dopant initiators 26. In this example, the uncharged dopants do not chemically react with the active region 22, rather they are present at the interface as the dopant.

The device 1000 of FIG. 5C is similar to that shown in FIGS. 2C, 2F and 2I, and like those devices, in some instances, the interface between the top electrode 14 and the active region 22 is non-conductive and forms a tunneling barrier when the device 1000 is in an OFF state. To reiterate from above, the rectification orientation of the device 1000 in its initial state is determined by the mobile dopant 24 profile in the initial state, which is determined by where (bottom or top interface) the dopant initiator 26 diffuses to. Therefore, the polarity of the voltage applied to switch the device 1000 is determined by how the mobile dopants 24 are formed using one of the various examples disclosed herein.

In any of the examples disclosed herein, selection of the materials for the active region 22 and the dopant initiators 26 (and thus the mobile dopants 24) contributes to achieving desirable device 1000, 1000' properties. Some examples of such materials have been described hereinabove. It is to be understood, however, that there is a wide range of materials that exhibit the desired combination of properties: electronically semiconducting or insulating and weak ionic conductor to enable the mobile dopants 24 to be injected by drift into and ejected out of the active region 22. In some instances, the Ellingham diagram of the metal oxide used in the active region 22 may be user to select the dopant initiator 26, 26'.

In general, any semiconducting material (making up active region 22) that is also a weak ionic conductor with respect to the mobile dopant 24 that can electrically dope the semiconductor will work in the examples disclosed herein. In other words, possible switch compounds for the active region 22 are semiconducting compounds with significant ionic contribution to the bonding. In a non-limiting example, the action region 22 is a material that is undoped and stoichiometric, and thus a good insulator, and the mobile dopant 24 is a large concentration of anion or cation vacancies contained in a layer of the same or related parent material. Basically, the layer having the mobile dopants 24 therein is very conductive and thus changing the doping concentration has a relatively small effect on the conductivity of this layer; but since the active region 22 is essentially intrinsic, even a small amount of mobile dopant 24 will have a very dramatic effect on the conductivity of this region 22.

As previously mentioned, in one example, the material for the active region 22 is selected from oxides, sulfides, selenides, nitrides, phosphides, arsenides, chlorides, and bromides of the transition and rare earth metals, with the alkaline earth metals often being present in compounds. Further, there are the various alloys of like compounds with each other, which offer a wide range of compositions if they are mutually soluble in each other. There are also mixed compounds, in which there are two, three or more different metal atoms combined with some number of the electronegative elements. In such instances, the mobile dopants 24 formed may be anion vacancies or different valent elements.

Materials for the active region 22 including the elements Ti, Zr and Hf are particularly attractive because they can be compatible with Si integrated circuit technology, since the primary oxidation state of all three metals is +4, the same as Si. As such, these elements would not create unintentional doping of the Si. These compounds are also known as titania, zirconia, and hafnia, respectively, and also by other names specific to the various polytypes of each. Still another example includes the alloys of these three oxides in pairs or with all three present simultaneously (e.g., $Ti_xZr_yHf_zO_2$, where $x+y+z=1$). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have the perovskite structure.

It is also possible to utilize alloys of these various compounds, such as $Ca_aSr_bBa_cTi_xZr_yHf_zO_3$, where $a+b+c=1$ and $x+y+z=1$. There is also a wide variety of other oxides of the transition and rare earth metals with different valencies that may be used, both individually and as more complex compounds. In each case, the mobile dopants 24 may be an oxygen vacancy or an aliovalent (e.g., different valence) element.

Yet another example of compounds suitable for the active region 22 includes the sulfides and selenides of the transition metals with some ionic bonding character, essentially the S and Se analogues of the oxides mentioned above. Still another example of compounds suitable for the active region 22 includes the semiconducting nitrides, such as AlN, GaN, ScN, YN, LaN, rare earth nitrides, and alloys of these compounds and more complex mixed metal nitrides. A still further example of compounds suitable for the active region 22 includes the semiconducting halides (such as CuCl, CuBr, and AgCl), or the phosphides and arsenides of various transition and rare earth metals, e.g., Sc, Y, La, etc. In each of the examples set forth in this paragraph, either anion vacancies or aliovalent elements may be formed as the mobile dopants 24.

It is to be further understood that the active region 22 may include sublayers of different materials or compounds chosen from the examples above.

The dopants employed in the examples disclosed herein may be hydrogen, alkali, and alkaline earth cations, transition metal cations, rare earth cations, oxygen anions or vacancies, chalcogenide anions or vacancies, nitrogen anions or vacancies, pnictide anions or vacancies, or halide anions or vacancies. As previously described, such charged dopants are formed via the chemical reaction of the portion of the active region 22 with the dopant initiators 26, 26'. Also as previously described, such uncharged dopants may be diffused or deposited, without a chemical reaction with the active region 22 to initiate their formation. Specific non-limiting examples of mobile dopant anions include carbon anions, sulfur anions, or phosphorus anions, and specific non-limiting examples of mobile dopant cations include aluminum cations, niobium cations, copper cations, and silver cations.

Specific examples of the combination of active regions 22, dopant initiators 26, 26', and the resulting layer including the dopants therein are set forth in the Table below. Based on the teachings herein, it is clear that one skilled in this art can develop other combinations of materials that provide the benefits taught.

TABLE 1

Examples of Active Regions, Dopant Initiators, and Resulting Mobile Dopant Layers

| Active Region | Dopant Initiator | Layer having Mobile Dopant Therein | Mobile Dopant |
|---|---|---|---|
| $TiO_2$ | Ti | $TiO_{2-x}$ | Oxygen vacancies or metal interstitials |
| $ZrO_2$ | Zr | $ZrO_{2-x}$ | Oxygen vacancies or metal interstitials |
| $HfO_2$ | Hf | $HfO_{2-x}$ | Oxygen vacancies or metal interstitials |
| $SrTiO_3$ | Sr or Ti | $SrTiO_{3-x}$ | Oxygen vacancies or metal interstitials |
| GaN | Ga | $GaN_{1-x}$ | Nitrogen vacancies |
| CuCl | Cu | $CuCl_{1-x}$ | Chlorine vacancies or copper interstitials |
| GaN | S | GaN:S | Sulfide ions |

To further illustrate example(s) of the present disclosure, an example is given herein. It is to be understood that this example is provided for illustrative purposes and is not to be construed as limiting the scope of the present disclosure.

EXAMPLE

A device was formed according to one of the methods disclosed herein. A titanium dopant initiator layer and a first platinum electrode were deposited on a $Si/SiO_2$ (100 nm) substrate via evaporating at room temperature (RT). The titanium dopant initiator layer had a thickness of 5 nm, and the first platinum electrode established thereon had a thickness of 15 nm. A $TiO_2$ layer (40 nm) was established on the first platinum electrode via sputter deposition from a TiO$_2$ (rutile) target in 1.5 mTorr Ar. The substrate was heated up to about 270° C. during sputter deposition. A second platinum electrode (30 nm) was then evaporated with an e-beam evaporator at RT after the TiO$_2$ layer was established. The top and bottom electrodes were patterned into bone shaped structures with a metal shadow mask, generating crossing point junctions with an area of 5×5 μm$^2$.

All of the junctions of this device were measured by a standard 4-point probe method where the bottom electrode was always grounded. Over 200 switching I-V loops were recorded, and for clarity, such loops are shown in gray in FIG. 6. After the 400th switching loop (shown in bold black in FIG. 6), the junction was still switchable and kept the ON/OFF conductance ratio of about 1000.

Figure 6:
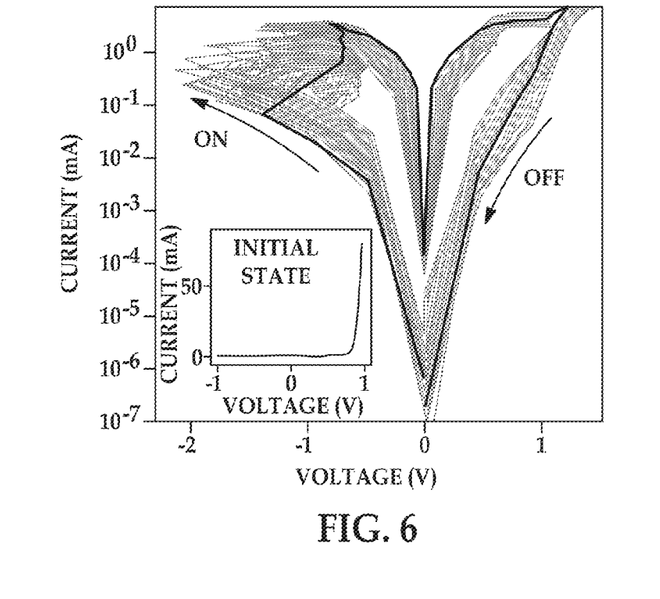
FIG. 6 is a graph depicting I-V loops of an example of the device, where the inset graph depicts the initial state I-V curve of the same device.

The initial state I-V curve (left inset in FIG. 6) is strongly rectified. It is believed that this rectification orientation arises from the fact that the interface (containing a TiO$_{2-x}$ layer) between the first platinum electrode and the TiO$_2$ layer is ohmic-like while the interface (containing the unreacted portion of the TiO$_2$ layer) is non-ohmic and controls the electronic transport. This rectification orientation determines the switching polarity of the device as shown in FIG. 6, in which switching ON is accomplished by a negative voltage and switching OFF is accomplished by a positive voltage.

The results discussed hereinbelow indicate that the titanium dopant initiator layer diffused through the first platinum Pt electrode and reacts with the TiO$_2$ layer to form TiO$_{2-x}$ having oxygen vacancies therein, thereby creating an ohmic-like contact.

In addition to the switching polarity, it is also believed that the device yield also depends on the titanium dopant initiator layer. Some of the results indicated that a device with a 1 nm thick titanium dopant initiator layer did not result in a desirable switchable device yield, at least when compared to the results for the device with the 5 nm thick titanium dopant initiator layer. It is believed that the thicker titanium dopant initiator layer provides enough titanium to diffuse through the grain boundaries of the 15 nm first platinum electrode and react with the TiO$_2$ layer, thereby creating oxygen vacancies and forming localized seeds of the switching centers.

Figure 7A:
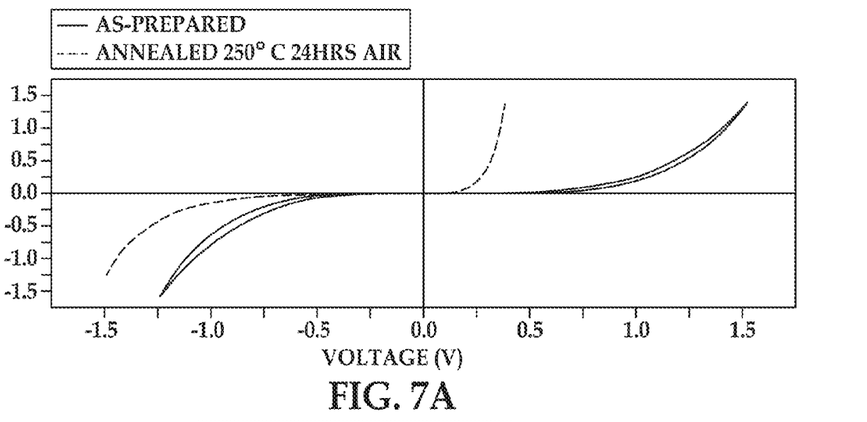
FIG. 7A is a graph comparing the I-V curve of a device not subjected to annealing, and a device subjected to annealing.
Figure 7B:
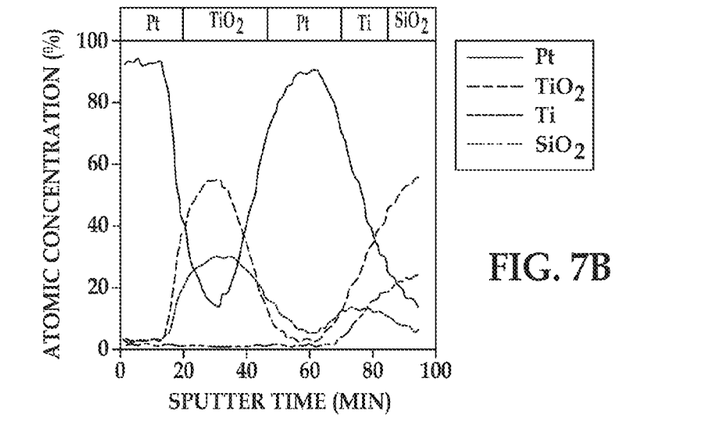
FIG. 7B is an X-ray photoelectron spectroscopy (XPS) depth profile for the device (shown schematically above the graph) not subjected to annealing.
Figure 7C:
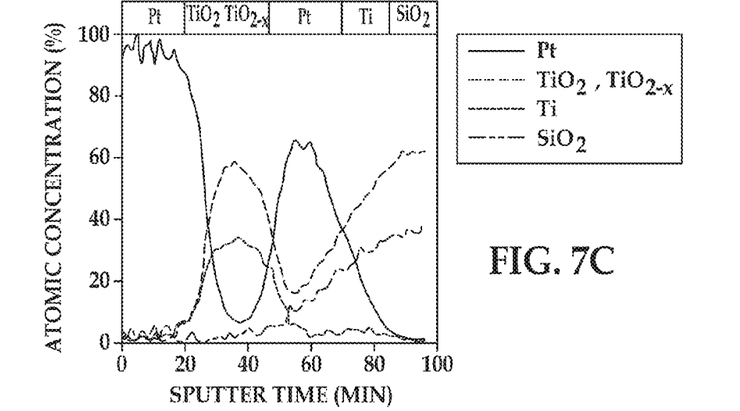
FIG. 7C is an X-ray photoelectron spectroscopy (XPS) depth profile for the device (shown schematically above the graph) subjected to annealing.

FIGS. 7A through 7C further supported the notion that the titanium in the titanium dopant initiator layer was diffusing to react with a portion of the TiO$_2$ layer. The device used to obtain the data shown in FIGS. 6A through 6C included the following layers: Si/SiO$_2$/Ti (5 nm)/Pt electrode (30 nm)/TiO$_2$ (15 nm)/Pt electrode (20 nm). The device was fabricated at RT and the TiO$_2$ layer was deposited by reactive sputtering from a Ti metal target in an Ar plus 10% O$_2$ gas mixture. The I-V curve of the as-prepared device was more or less symmetric as shown in FIG. 6A. These results suggest that the two interfaces were almost identical and the titanium dopant initiator layer did not significantly affect the junction. In contrast, after 24 hours of annealing at 250° C. in air, the I-V curve became rectifying and the rectification orientation indicated that the bottom interface became ohmic-like (see FIG. 7A).

The results of annealing may be seen by comparing the X-ray photoelectron spectroscopy (XPS) depth profiles in FIGS. 6B and 6C. The distinct profile peak for the titanium dopant initiator layer (about 5 nm between the SiO$_2$ and the bottom Pt layer) in the as-prepared junction (FIG. 7B) almost disappeared in the annealed junction (FIG. 7C). As schematically shown above the graph in FIG. 7C, the titanium dopant initiator layer partially diffused through the platinum electrode and formed vacancies close to the bottom electrode/TiO$_2$ layer interface, resulting in an ohmic-like bottom interface contact.

While several examples have been described in detail, it will be apparent to those skilled in the art that the disclosed examples may be modified. Therefore, the foregoing description is to be considered exemplary rather than limiting.

What is claimed is:

1. A method for controlling the formation of dopants in an electrically actuated device, the method comprising:
    annealing a dopant initiator layer and an electrode positioned on the dopant initiator layer, thereby causing some dopant initiators in the dopant initiator layer to diffuse through the electrode to an exposed surface of the electrode; and
    after the annealing, depositing an active region on the diffused dopant initiators and the exposed surface of the electrode, whereby the diffused dopant initiators react with a portion of the active region in contact therewith to form a layer including the dopants at an interface between the electrode and an unreacted portion of the active region.

2. The method as defined in claim 1 wherein the dopant initiators chemically react with the portion of the active region to form the dopants, and wherein the dopants are selected from the group consisting of charged interstitials, charged vacancies, or charged impurities.

3. The method as defined in claim 1 wherein:
    the active region is a metal oxide; and
    the dopant initiators chemically react with the portion of the metal oxide to form the dopants, thereby causing a reduction of the portion of the metal oxide.

4. The method as defined in claim 3 wherein the metal oxide is TiO$_2$, the dopant initiators are Ti, the reduced portion of the metal oxide is a TiO$_{2-x}$ layer, and the dopants are oxygen vacancies.

5. The method as defined in claim 3 wherein the active region is ZrO$_2$, the dopant initiators are Zr, the reduced portion of the metal oxide is a ZrO$_{2-x}$ layer, and the dopants are oxygen vacancies.

6. The method as defined in claim 3 wherein the active region is HfO$_2$, the dopant initiators are Hf, the reduced portion of the metal oxide is a HfO$_{2-x}$ layer, and the dopants are oxygen vacancies.

7. The method as defined in claim 3 wherein the active region is TaO$_2$, the dopant initiators are Ta, the reduced portion of the metal oxide is a TaO$_{2-x}$ layer, and the dopants are oxygen vacancies.

8. The method as defined in claim 1, further comprising controlling the diffusion of the dopant initiators by at least one of:
    adjusting a thickness of the electrode;
    adjusting a grain size of the electrode;
    adjusting a temperature at which the annealing is accomplished;
    adjusting a period of time for which the annealing is accomplished; or
    adjusting a thickness of the dopant initiator layer.

9. The method as defined in claim 8, further comprising configuring predetermined properties at the interface by controlling the diffusion.

10. The method as defined in claim 1 wherein a temperature of the annealing ranges from about 200° C. and about 450° C.

11. The method as defined in claim 1, further comprising controlling the annealing so that some other dopant initiators remain in the dopant initiator layer.

\* \* \* \* \*